United States Patent [19]
Min et al.

[11] Patent Number: 5,173,760
[45] Date of Patent: Dec. 22, 1992

[54] BICMOS SEMICONDUCTOR DEVICE

[75] Inventors: Sung-Ki Min, Inchun; Chang-Won Kahng, Seoul; Uk-Rae Cho; Jong-Mil Youn, both of Kyoungsangbuk-do; Suk-Gi Choi, Seoul, all of Rep. of Korea

[73] Assignee: Samsung Electronics Co., Ltd., Kyungki-do, Rep. of Korea

[21] Appl. No.: 498,590

[22] Filed: Mar. 26, 1990

Related U.S. Application Data

[62] Division of Ser. No. 265,420, Oct. 31, 1988, Pat. No. 4,912,055.

[30] Foreign Application Priority Data

Nov. 3, 1987 [KR] Rep. of Korea ............ 12279/1987

[51] Int. Cl.$^5$ .................................................. H01L 27/02
[52] U.S. Cl. .................................................. 257/378
[58] Field of Search ............ 357/43, 47, 59, 51, 357/68

[56] References Cited

U.S. PATENT DOCUMENTS

| | | | |
|---|---|---|---|
| 4,403,395 | 9/1983 | Curran | 437/31 |
| 4,475,279 | 10/1984 | Gable | 437/31 |
| 4,484,388 | 11/1984 | Iwasaki | 437/31 |
| 4,637,125 | 1/1987 | Iwasaki et al. | 437/76 |
| 4,760,033 | 7/1988 | Mueller | 437/57 |

FOREIGN PATENT DOCUMENTS

| | | | |
|---|---|---|---|
| 0139266 | 5/1985 | European Pat. Off. | 357/43 |
| 0236153 | 10/1986 | Japan | 357/43 |

OTHER PUBLICATIONS

IBM Technical Disclosure Bulletin, vol. 28 #9, pp. 3813-3815 Feb. 1986.

*Primary Examiner*—Mark V. Prenty
*Attorney, Agent, or Firm*—Robert E. Bushnell

[57] ABSTRACT

A method for fabricating a BiCMOS device to achieve a maximum performance through a minimum processing steps, in which the BiCMOS device comprises high integration and high performance MOS transistors, self-aligned metal contact emitter type bipolar transistors having high load driving force, high performance matching characteristics and high integration, and self-aligned polycrystalline silicon emitter type bipolar transistors having high integration and high speed characteristics in low current, thereby being used in high integration, high speed digital and precise analog system. Said method comprises a plurality of fabrication steps including ion-implantation, formation of thin film oxide layer, deposition of nitride layer, etching of oxide layer, formation of windows and others, alternately or/and sequentially in a single chip substrate.

3 Claims, 14 Drawing Sheets

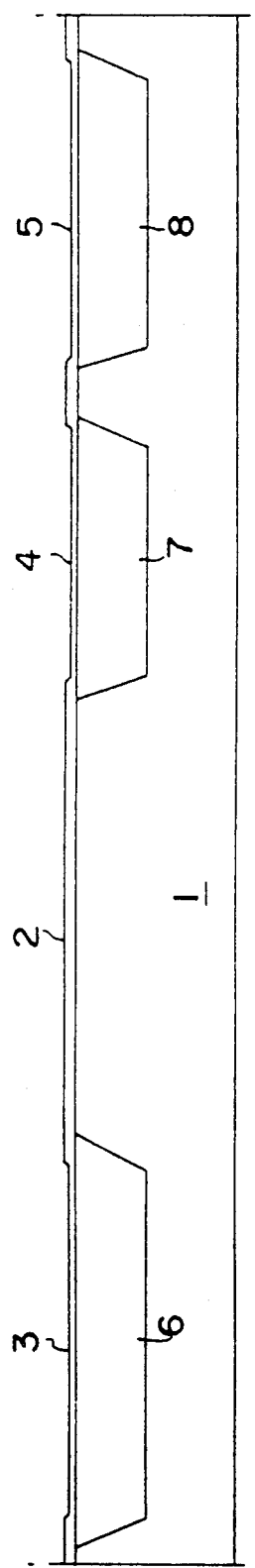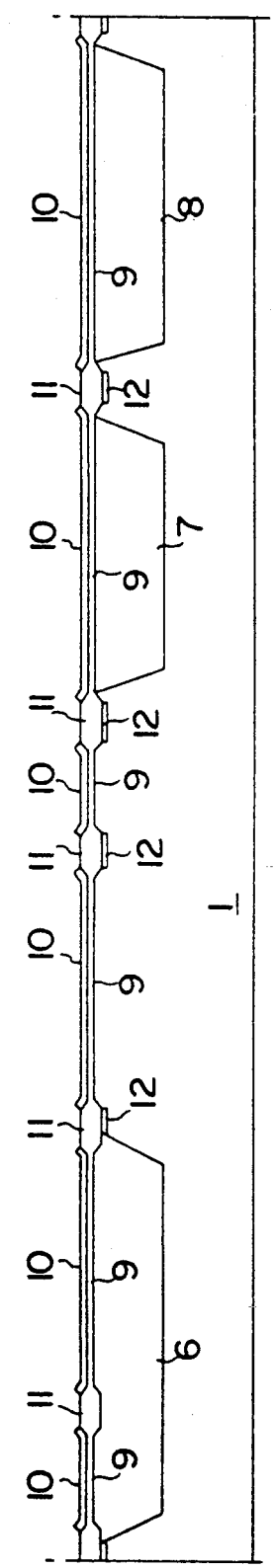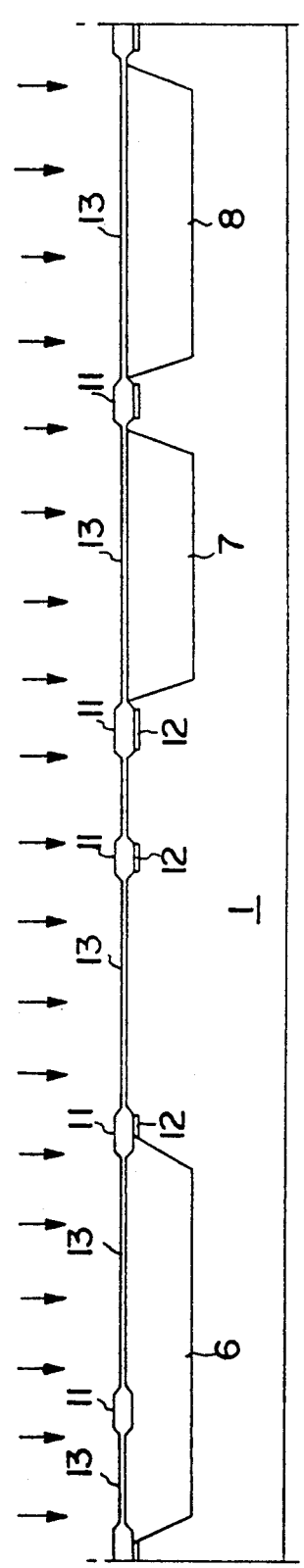
FIG.1A
FIG.1B
FIG.1C

BICMOS SEMICONDUCTOR DEVICE

This is a divisional of application Ser. No. 07/265,420, filed Oct. 31, 1988 and now U.S. Pat. No. 4,912,055.

BACKGROUND OF THE INVENTION

This invention relates to a method for fabricating a semiconductor device, and more particularly to a method for forming an a single crystal semiconductor chip bipolar transistors, CMOS transistors, MOS capacitors, and resistors.

A semiconductor device comprising bipolar transistors and CMOS transistors which are formed on a semiconductor chip is generally called BiCMOS. The VLSI-class BiCMOS technology of prior art has been developed principally for high performance memory or logic, so that it is suitable for high integration and high speed logic. The BiCMOS technology for high performance memory and high speed, low power, high density logic of prior art is disclosed in page 212, ISSCC Digest of Technical Papers published in February, 1986 and in page 63, CICC Tech. Dig. published in May, 1986.

In order to achieve high performance digital and analog VLSI function on a single chip with prior art, there should be provided MOS elements, bipolar elements, resistors, capacitors, etc for a precise analog function and high speed, high integration digital function. However, because these elements have not been optimized for their construction and performance, there are limitations in their applications. Furthermore, a BiCMOS device of prior art having a complex self-aligned bipolar structure for high speed of element complicates the construction thereof, thus being unsuitable for mass production and cost. Alternatively, another BiCMOS device of prior art using non-self-aligned structure reduces its performance. In the bipolar structure of prior art as disclosed in pages 1010-1013, No.9, Vol. Ed-28, IEEE published in September, 1981, it is difficult to reduce the size of the structure due to the problem consisting in the scaling down of the elements. Additionally, the self-aligned bipolar technology as disclosed in pages 338-340, No.8, Vol.ED-8, IEEE provides a method for solving the problem consisting in the scaling down of the elements, but the method thereof is complicated. Further, according to the prior art as disclosed in U.S. Pat. No. 4,503,603 of L. Blossfeld, after ion implantation is performed twice into the base region and a local oxidation is done, the emitter region is formed to produce a self-aligned bipolar structure. However, since this method requires a number of heat treatments, it makes it difficult to control the shallow junction depth of the active base layer for forming a high speed and high integration bipolar transistor. Consequently, such a bipolar structure of prior art causes a problem in the method for high performance BiCMOS.

SUMMARY OF THE INVENTION

It is an object of the present invention to provide a method for fabricating a BiCMOS device to have a maximum performance through a minimum processing steps, which BiCMOS device comprises high integration and high performance MOS transistors, self-aligned metal contact type bipolar transistors having high load driving force, high performance matching characteristics and high integration, and self-aligned polycrystalline silicon emitter type bipolar transistors having high integration and high speed characteristics in low current, thereby being used in high integration, high speed digital and precise analog.

It is another object of the present invention to provide a method for fabricating a BiCMOS device, whereby MOS capacitors and resistors are formed on a single chip together with MOS transistors and bipolar transistors through a simple process, and the interconnections between them are easily made, thereby producing the highest performance elements through a minimum processing steps.

It is a further object of the present invention to provide a method for fabricating a BiCMOS device, which method is directed at simplicity and high performance of elements, and accommodates to the fine processing technology.

According to the present invention, a method for fabricating a semiconductor device having first and second MOSFETs and first and second bipolar transistors in a first conductivity type silicon substrate, comprising the steps of:

(a) implanting second conductivity type ions into predetermined regions of the substrate and activating the ion implanted regions so as to form the first region for forming the first MOSFET, the third region for forming the first bipolar transistor, and the fourth region for forming the second bipolar transistor;

(b) forming element-isolation oxide thin film layers between the elements of the transistors so as to isolate the elements from each other on the substrate, and first conductivity-type channel stopper region below the oxide layers;

(c) forming an oxide thin film layer for the gates of the first and second MOSFETs on the upper surface of the substrate;

(d) forming gates of the first and second MOSFETs with doped polycrystalline silicon over the gate oxide in the first and second regions;

(e) depositing a nitride thin film layer for masking on the whole upper surface of the substrate and removing the nitride layer from predetermined portions of the third and fourth regions of the substrate;

(f) etching the oxide layer of predetermined portions of the third and fourth regions and implanting first conductivity-type ions into the etched portions so as to form the inactive base regions of the first and second bipolar transistors;

(g) forming oxide thin film layers on the third and fourth regions of the substrate by employing the nitride layer as a mask;

(h) implanting first conductivity-type ions into predetermined portions of the third and fourth regions of the substrate so as to form the active base regions of the first and second bipolar transistors;

(i) implanting second conductivity-type ions so as to form the low concentration drain and source of the second MOSFET;

(j) forming an oxide thin-film layer on the whole surface of the substrate and etching the oxide layer without any separate mask so as to form oxide-layer spacers on the sidewalls of the gates of the first and second MOSFETs;

(k) implanting second conductivity-type ions so as to form the substrate connecting region of the first MOSFET of the first region, the collector connecting region of the third and fourth regions, the emitter region of the second bipolar transistor, the high concentration drain and source regions of the second MOSFET, and the collector connecting regions of the first and second bipolar transistors;

(l) implanting first conductivity-type ions so as to form the drain and source regions of the first MOSFET of the first region and the substrate connecting region of the second MOSFET of the second region;

(m) forming an oxide thin film layer on the whole surface of the substrate and making the emitter connecting windows of the first bipolar transistor;

(n) forming the emitter connecting portion of the first bipolar transistor with second polycrystalline silicon on the upper portion of the third region;

(o) making the windows for connecting with the drain and source regions of the first and second MOSFETs, the emitter, base and collector regions of the first and second bipolar transistors, and the substrate connecting regions of the first and second MOSFETs;

(p) making connections with the conduction layer through the windows; and (q) depositing a protecting layer on the whole surface of the substrate and then exposing a pad for wire-welding.

DETAILED DESCRIPTION OF PREFERED EMBODIMENTS

The present invention will be now described more specifically with reference to the drawings attached by way of example only.

Figure 1D:
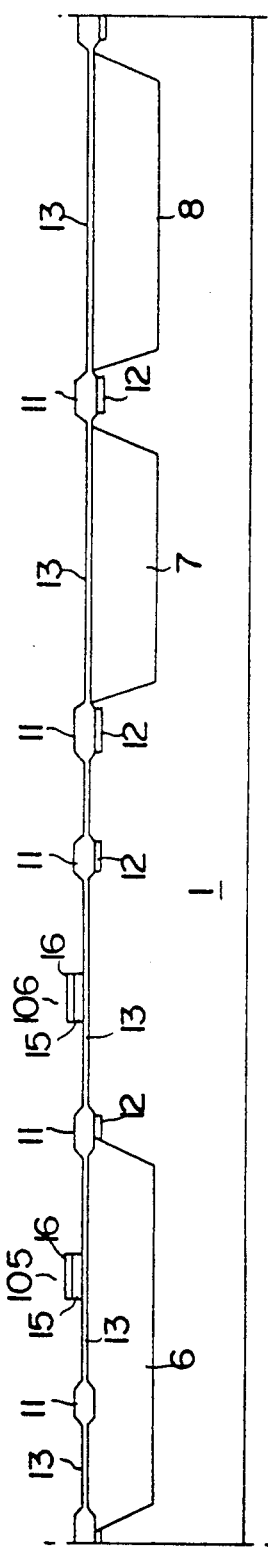
FIGS. 1A to 1P and 1A' to 1P' illustrate cross-sectionally an embodiment of the method according to the present invention.
Figure 1E:
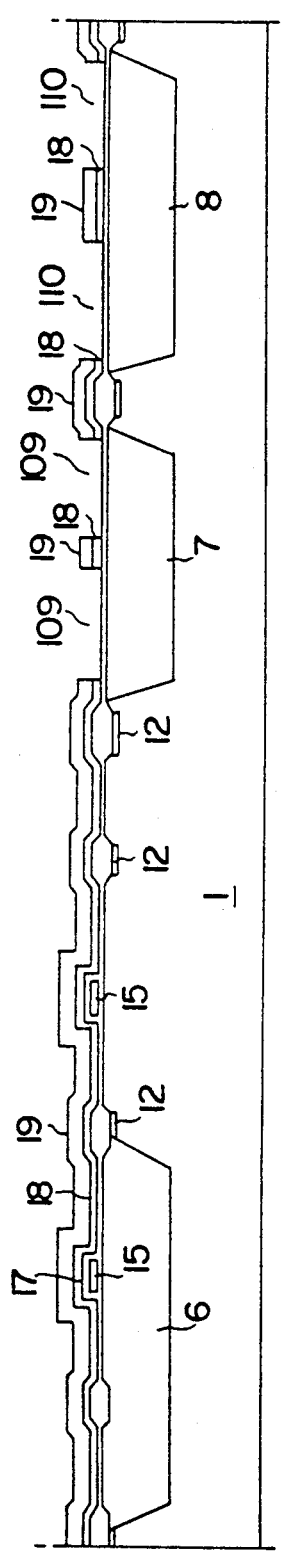
Figure 1F:
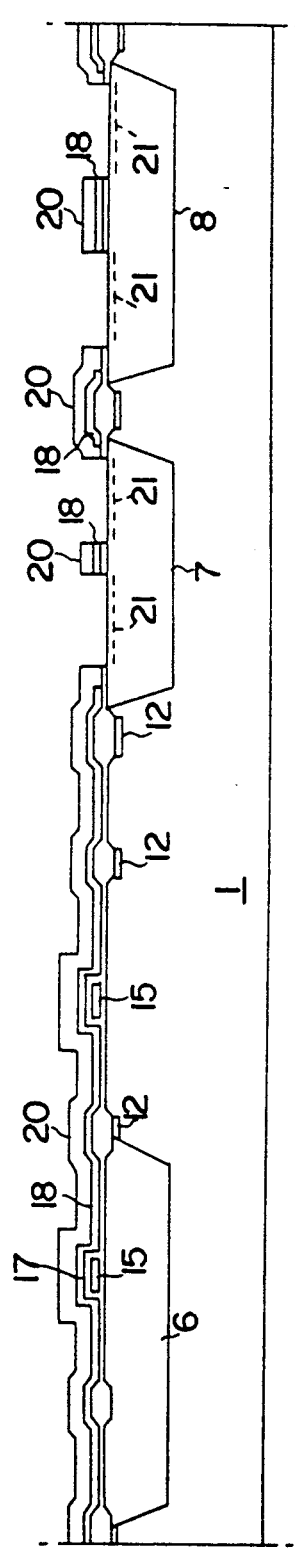
Figure 1G:
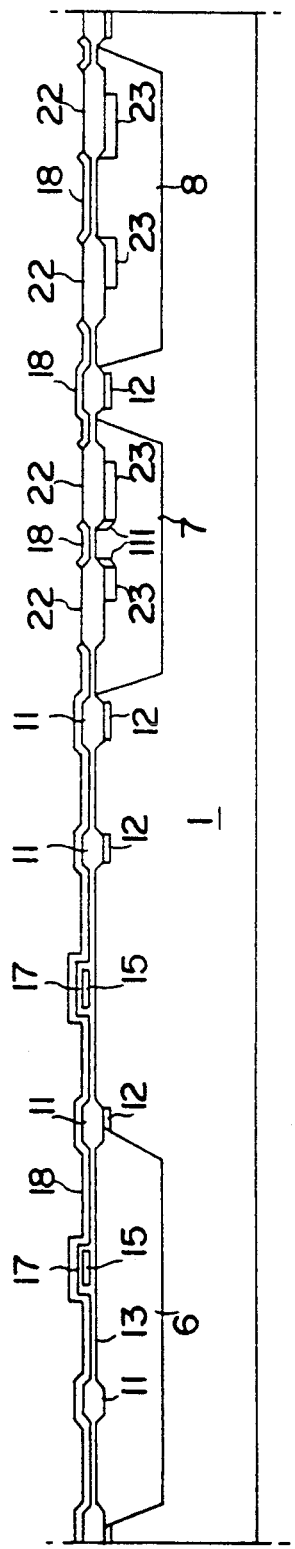
Figure 1H:
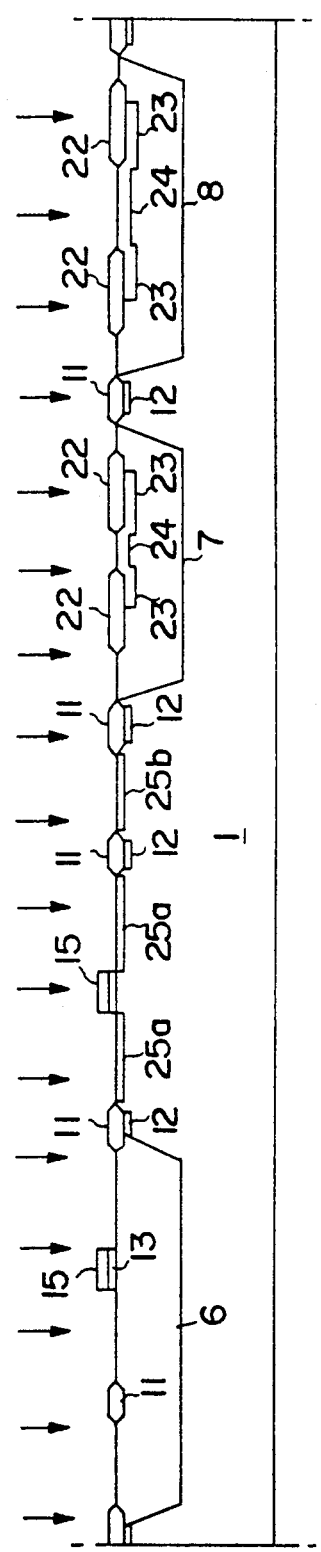
Figure 1I:
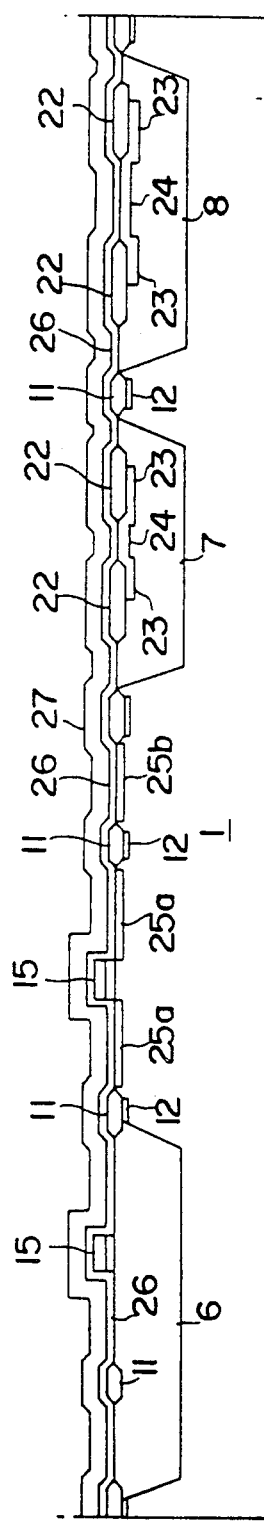
Figure 1J:
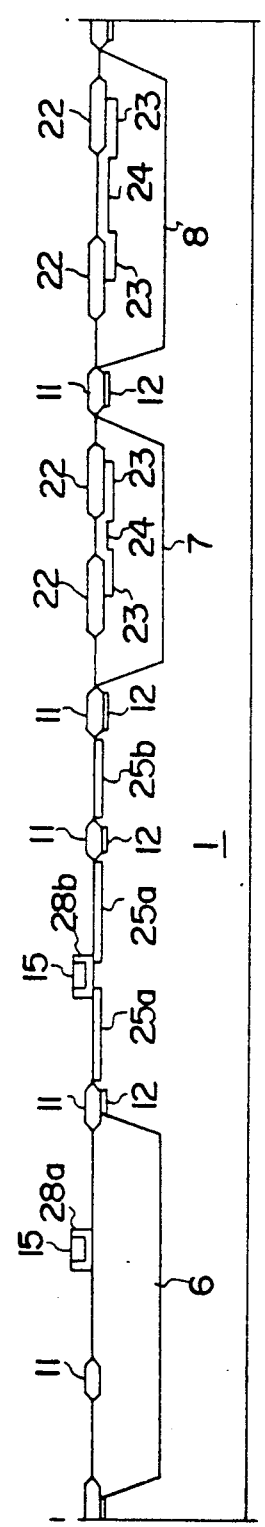
Figure 1K:
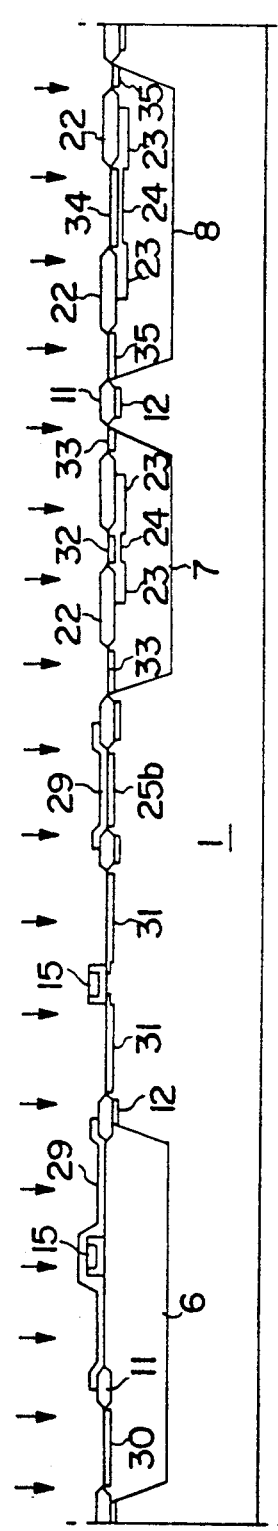
Figure 1L:
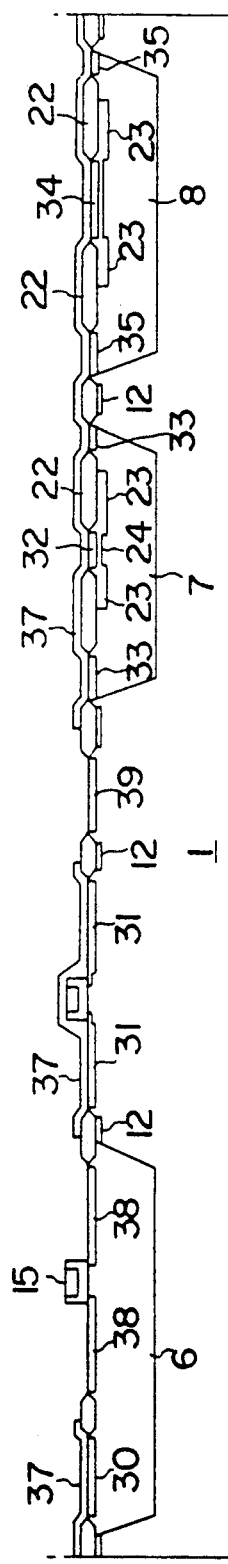
Figure 1M:
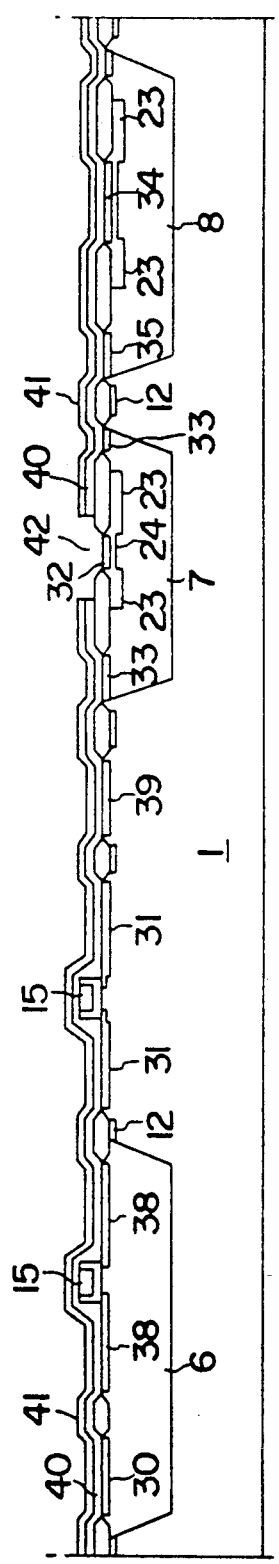
Figure 1N:
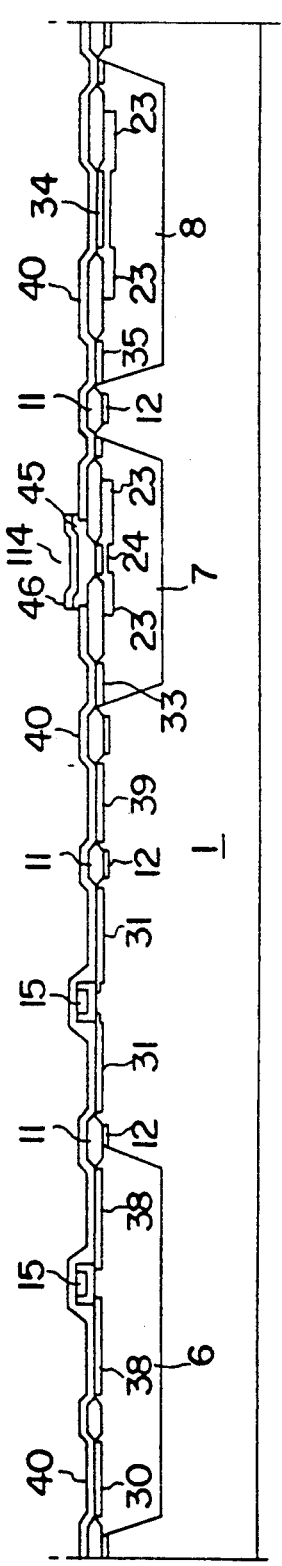
Figure 1O:
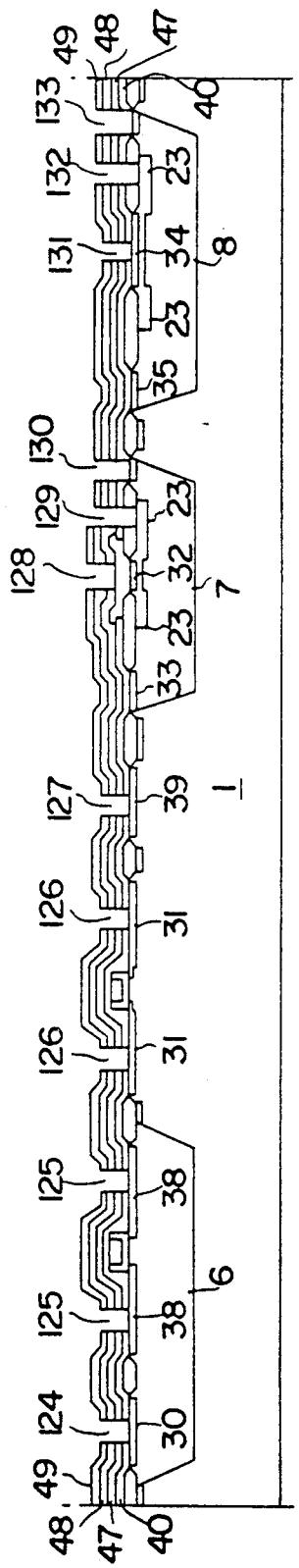
Figure 1P:
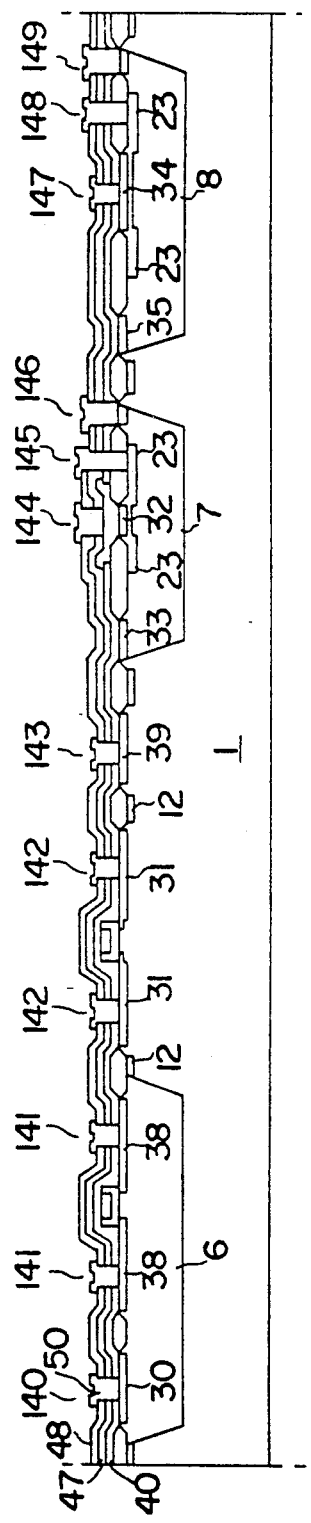
Figure 1A:
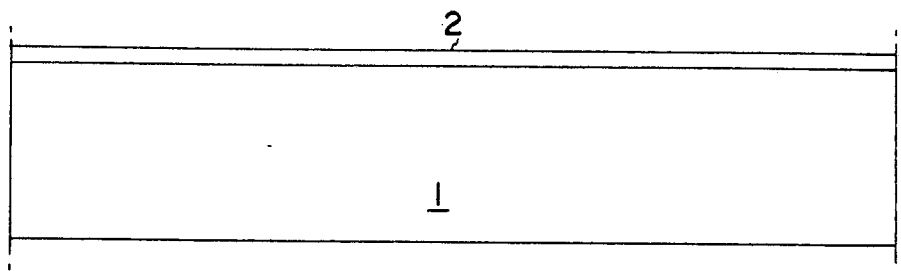

FIGS. 1A to 1P and 1A' to 1P' illustrate sequentially an embodiment of the method according to the present invention for fabricating a DBiCMOS. FIGS. 1A to 1P illustrate cross-sectional views for fabricating the active element portions of a BiCMOS which comprise PMOS transistor, NMOS transistor of LDD(Lightly Doped Drain) structure, self-aligned metal contact type bipolar transistor having high load driving force, high performance matching characteristic and high integration, and self-aligned polycrystalline silicon emitter type bipolar transistor having high speed characteristic in low current and high integration.

The influences that the interface between the single crystal emitter region and the polycrystalline silicon region exerts to the element characteristic and the circuit characteristic are depicted in pages 1346-1353, No.6, ED-34, IEEE published in June, 1987 and pages 47-48, Dig. Tech. Papers, VLSI Technology, Symp. published in May, 1986.

FIGS. 1A' to 1P' illustrate another cross-sectional views for fabricating the passive element portions of a BiCMOS which comprise capacitor, resistor region, the connecting region between the first polycrystalline silicon and the second polycrystalline silicon, etc. Hence, it will be noted that FIGS. 1A to 1P and 1A' to 1P' illustrate a single successive method carried out on a single substrate. The starting material is P-type single crystal silicon substrate 1 whose crystal orientation and specific resistivity are respectively $<100>$ and $2$-$20\Omega$·cm.

On the substrate 1 is formed oxide thin-film layer 2 for masking, and thereafter, on the oxide layer 2 is deposited photoresist. By means of conventional photolithography are formed the windows 3,4,5 of the first, third and fourth regions of the substrate. The first region (or well) is to form a PMOS transistor, and the third and fourth regions (or collector regions) are respectively to form a polycrystalline silicon emitter type NPN transistor and a metal contact emitter NPN transistor. Through the windows is implanted the impurities of group V such as phosphorus with an energy of about 160 KeV and a dose of $10^{12}$-$10^{14}$ ions/cm$^2$. Thereafter, the photoresist used as a mask during the ion implantation is removed, and under the atmosphere of oxygen and nitrogen at the temperature of 1000° C. to 1200° C. is activated and diffused the implanted impurities to form the first, third and fourth regions (6,7,8) of N-type having the depth of about 2.5 $\mu$m, as shown in FIG. 1(A).

Subsequently, the oxide layer 2 on the substrate 1 is all removed, and then, on the whole surface of the substrate is formed an oxide thin film layer 9 having the thickness of about 500 Å. On the upper surface of the oxide layer 9 is formed a nitride thin-film layer 10 of Si3N4 having the thickness of about 1500 Å by means of conventional low pressure CVD (Chemical Vapor Deposition). The masking layer consisting of the oxide layer 9 and the nitride layer 10 keeps the silicon surface of the substrate 1 below the masking layer from oxidizing in the subsequent oxidation method. The nitride layer of the region where an element-isolation oxide layer is formed is removed by conventional photolithography, and on the upper sides of the first, third and fourth regions is formed an ion implantation mask of photoresist. Thereafter, in order to establish an electrical isolation between elements are ion-implanted the impurities of group III such as boron into the region rid of the nitride layer 10 except the first, third and fourth regions of the substrate with an energy of about 30 KeV and a dose of $10^{12}$ to $10^{14}$ ions/cm$^2$. Subsequently, the photoresist is removed, and by means of conventional heat treatment is formed the element-isolation oxide layer 11, as shown FIGS. 1B and 1B'. During this oxidation method, the surface below the masking layer 9,10 of the silicon substrate is not oxidized, but the surface region not protected by the masking layer 9,10 of the silicon substrate is oxidized.

Figure 1B:
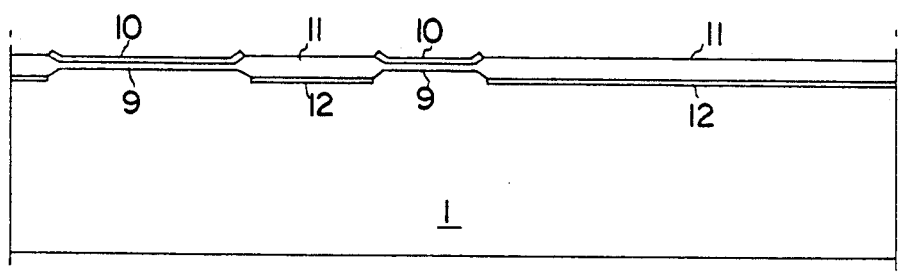
Figure 1C:
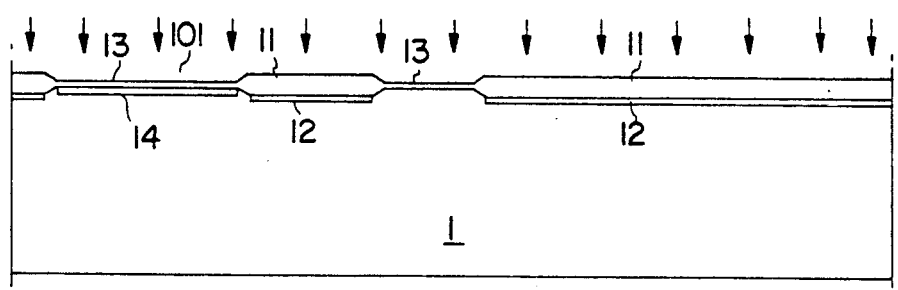
Figure 1D:
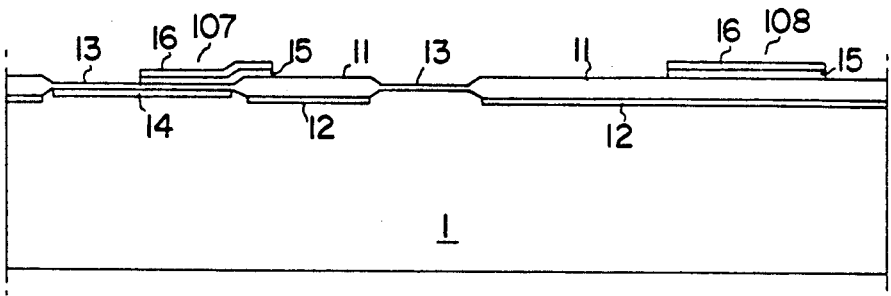
Figure 1E:
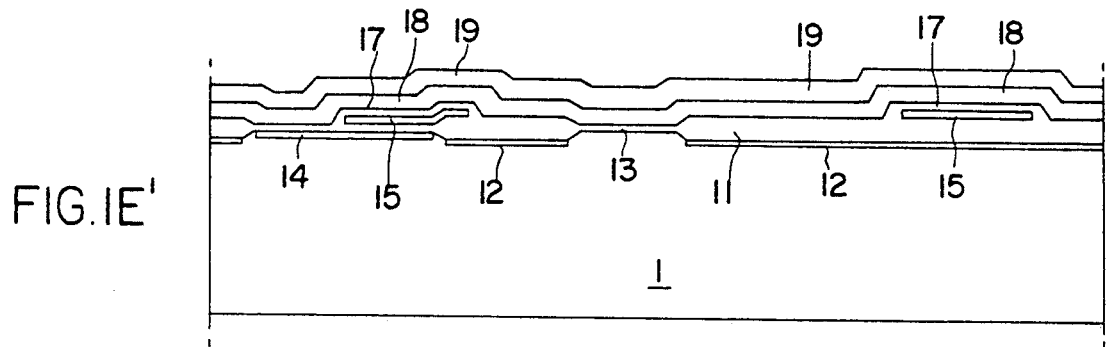
Figure 1F:
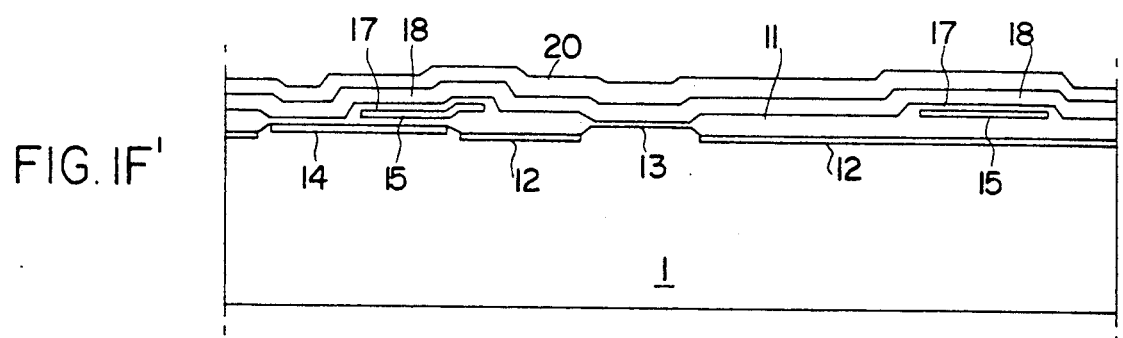
Figure 1G:
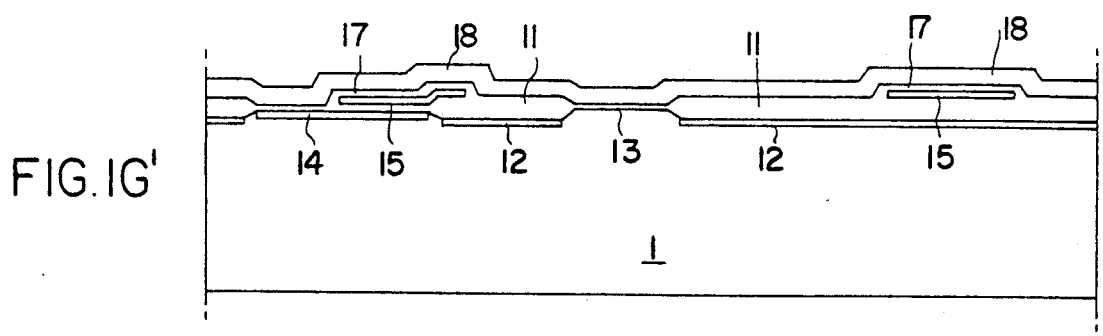
Figure 1H:
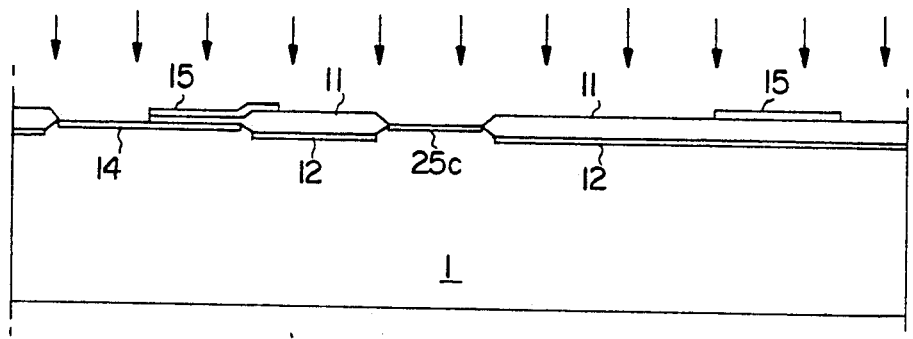
Figure 1I:
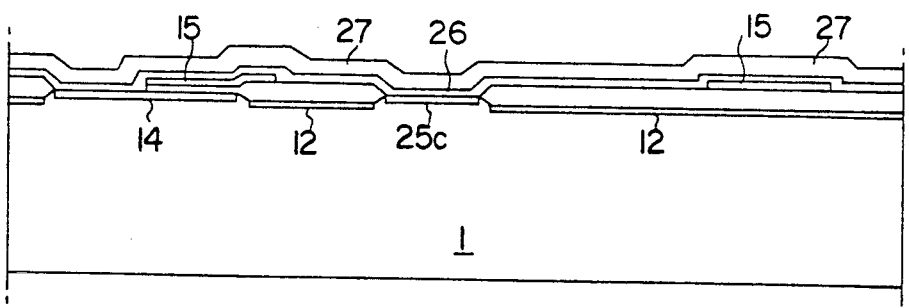
Figure 1J:
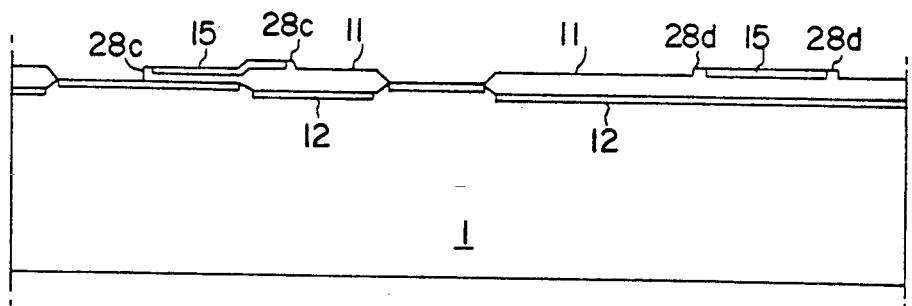
Figure 1K:
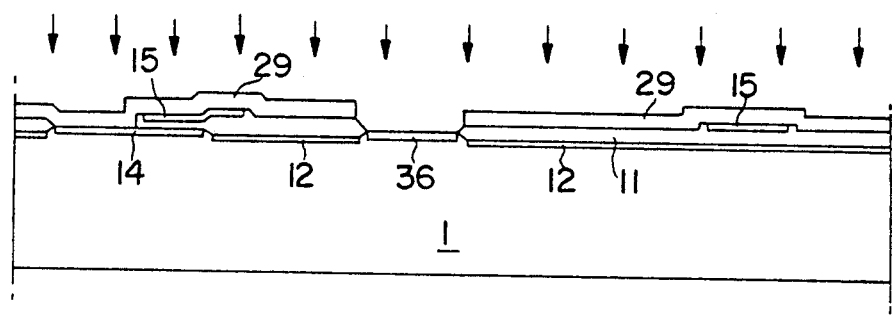
Figure 1L:
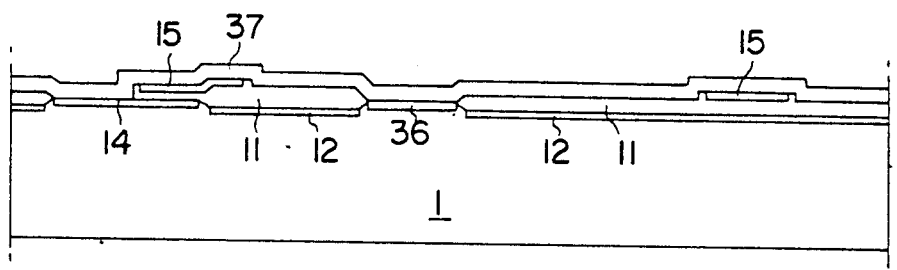
Figure 1M:
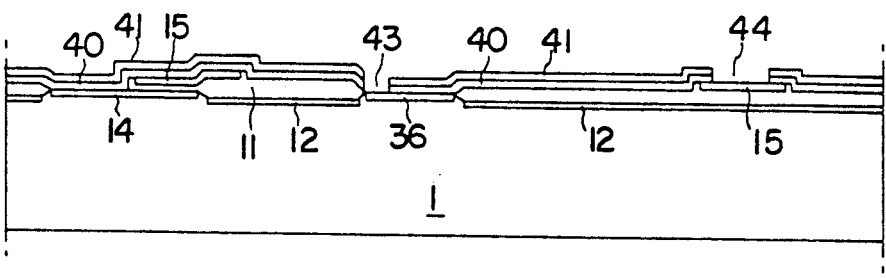
Figure 1N:
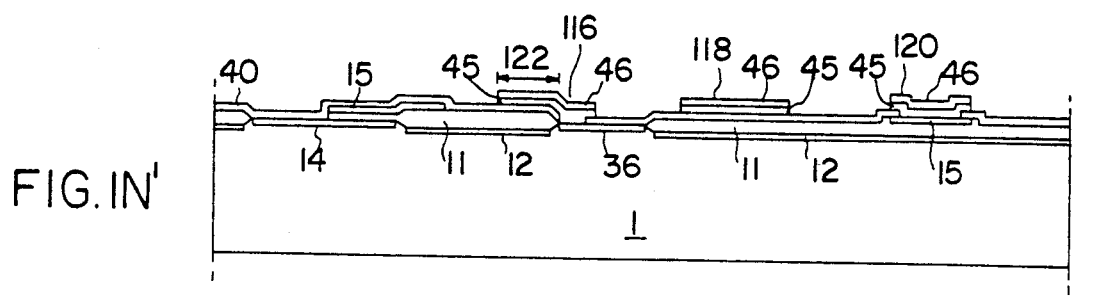
Figure 1O:
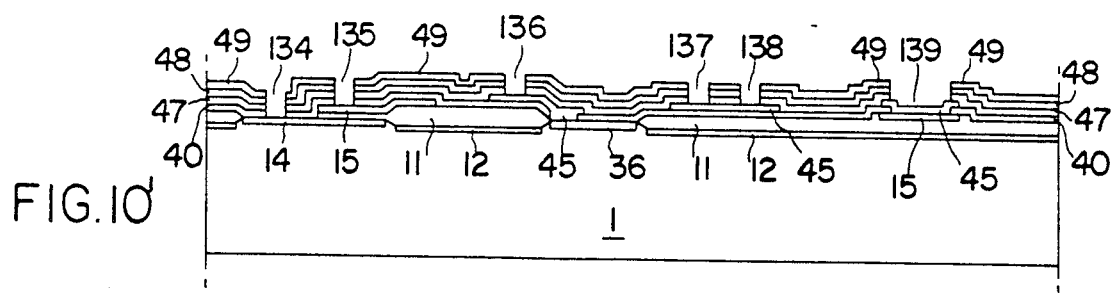
Figure 1P:
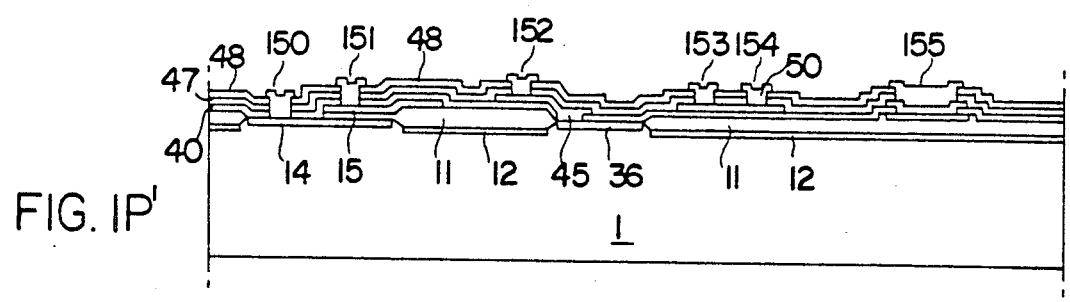

Further, the implanted ions of group III such as boron are activated to form a high concentration P-type channel stopper region 12 so as to prevent channel formation, as shown FIGS. 1B and 1B'. After growing the element-isolation oxide layer 11, the nitride layer 10 is removed by using conventional nitride etching without any mask, and thereafter, the heat treating sacrificial oxidation method for substrate surface cleaning is carried out to form a sacrificial oxide layer having the thickness of about 550 Å. Then, in order to form the passive element of a MOS capacitor is deposited a photoresist on the substrate region except the MOS capacitor region 101, and the impurities of group V such as arsenic are implanted with a dose of $10^{15}$ to $10^{16}$ ions/cm$^2$ by using the photoresist as an ion implantation mask, whereafter the photoresist is removed. Etching the sacrificial oxide layer on the substrate surface without using any mask, the element-isolation oxide layer 11 is reduced by the thickness of the sacrificial oxide layer, and the substrate surface not forming the element-isolation oxide layer 11 is exposed. On the exposed substrate surface is formed an oxide layer 13 having the thickness of 200 to 500 Å in order to form the gate insulating layer of the MOS transistor and the dielectric layer of the capacitor by means of conventional heat treating oxidation, as shown FIGS. 1C and 1C'. In this case, the ions of group V such as arsenic implanted into the MOS capacitor region is activated to form MOS capacitor electrode region 14. Into the whole surface of the silicon substrate are implanted the impurities of group III such as boron with a low energy of about 30 KeV and a dose of $10^{11}$–$10^{13}$ ions/cm$^2$ in order to adjust the threshold voltages of the NMOS transistor and PMOS transistor to about 0.8 Volt, as shown in FIGS. 1C and 1C'. Being used as the gate electrode material of the MOS transistors, connecting element material and the electrode plate material having a certain area on the dielectric layer of the capacitor, the first polycrystalline silicon layer 15 having the thickness of about 4000 Å is formed on the whole surface of the substrate by conventional low pressure CVD, and thereafter, the impurities of group V such as phosphorus are caused to penetrate the silicon layer 15 to reduce the resistance thereof.

For example, using POC13 at the temperature of 900° C. gives the first polycrystalline silicon a resistance of about 20Ω/□. Thereafter, as shown in FIGS. 1D and 1D', in order to form polycrystalline silicon region 105 for the gate of the PMOS transistor, polycrystalline silicon region 106 for the gate of the NMOS transistor, polycrystalline silicon region 107 for the upper electrode of the capacitor dielectric layer, and polycrystalline silicon region for connecting elements, i.e., first polycrystalline silicon region 108 for connecting with second polycrystalline silicon in the subsequent method, photoresist 16 is deposited on the above regions, and first polycrystalline silicon in the remaining regions is removed by conventional etching, whereafter the photoresist 16 is removed.

Then, as shown in FIGS. 1E and 1E', conventional heat treating oxidation method is carried out at the temperature of about 900° C. to form an oxide layer 17 having the thickness of about 500 Å on the whole surface of the substrate, on which a nitride layer 18 having the thickness of about 1000 Å is formed by conventional low pressure CVD. It will be noted that the oxide layer 13 becomes thick by the oxide layer 17 growing on the first polycrystalline silicon layer 15 in the heat oxidation method. The masking layer consisting of the oxide layer 17 and the nitride layer 18 servers as a mask for the subsequent method for forming the base of NPN transistors so that the impurities of group III such as boron are selectively implanted, and in the subsequent oxidation method keeps the silicon of the substrate surface below the masking layer from oxidizing. On the upper surface of the masking layer 17,18 except the regions 109,110 for forming the inactive base of the NPN transistor is formed a mask of photoresist 19, and the exposed nitride layer (18) not masked is removed, thereafter, the photoresist 19 is removed Then, as shown in FIGS. 1F and 1F', for the base forming of the NPN transistor is formed a mask 20 of photoresist, and the exposed oxide layer 17 is etched, thereafter the impurities of group III such as boron are implanted with an energy of about 35 KeV and a dose of $1 \times 10^{14}$ to $5 \times 10^{14}$ ions/cm$^2$. Subsequently, by conventional method is removed the photoresist 20, and by using the nitride layer 18 as an anti-oxidation mask is carried the oxidation method, thereby resulting in an oxide layer 22 having the thickness of 2000 to 3000 Å formed on the silicon surface exposed by the etching, as shown in FIGS. 1G and 1G', when the impurities 21 of group III such as boron implanted into the inactive base region are simultaneously activated to diffuse horizontally and vertically, forming the inactive base region 23.

This horizontal diffusion serves as link-up region III of relatively low concentration to be connected with the subsequently formed active base region. By conventional nitride layer etching is removed the nitride layer 18, the oxide layer 13 below the nitride layer and the thin oxide layer 17 on the upper surface of the first polycrystalline silicon is etched, after which is formed a mask of photoresist for forming the active base of the NPN transistor, and the impurities of group III such as boron are implanted with an energy of 50 KeV and a dose of $3 \times 10^{13}$ ions/cm$^2$ to form the active base region 24 of low concentration of the NPN transistor formed on the upper surfaces of the third and fourth regions. In this case, after the nitride layer and oxide layer of the NPN transistor region is removed, the ion implantation is carried out. However, it will be easily understood that without etching the nitride and oxide layer can be implanted the impurities of group III such as boron with a high energy to pass those insulating layers so as to form the active base region.

Then, after removing the above photoresist, into the whole surface of the substrate are implanted the impurities of group V such as phosphorus with an energy of 30 KeV and a dose of $10^{12}$–$10^{13}$ ions/cm$^2$ to form the source and drain region 25a of low concentration doped drain (LDD) type NMOS transistor and low concentration n-type region 25b,25c, as shown in FIGS. 1H and 1H'. Thereafter, the conventional heat treating oxidation method is carried out at the temperature of about 900° C. to form an oxide layer 26 having the thickness of about 500 Å, and on the whole surface of the silicon substrate, as shown in FIGS. 1I and 1I', is formed an oxide layer 27 by conventional CVD. Subsequently, the oxide layer 26 and CVD oxide layer 27 are etched by conventional dry etching to form oxide layer spacers 28a, 28b, 28c, 28d on the sidewalls of the first polycrystalline silicon, as shown in FIGS. 1J and 1J'. The oxide layer spaces 28b of the gate sidewalls of the second region NMOS transistor among the above oxide layer spacers 28a, 28b, 28c, 28d can cause a NMOS transistor of the LDD structure to be formed.

Then, as shown in FIGS. 1K and 1K', on the upper surface of the silicon substrate is formed photoresist 29, and the impurities of group V such as arsenic are implanted with an energy of about 40–80 KeV and a dose of $10^{14}$ to $10^{16}$ ions/cm$^2$ so as to form the connecting region 30 for the first region of PMOS transistor, the high concentralion source and drain region 31 of NMOS transistor, the emitter region 32 of the polycrystalline silicon emitter NPN transistor and the collector connecting region 33 of the third region, the emitter region 34 of the metal contact emitter NPN transistor and the collector connecting region 35 of the fourth region, and the lower region 36 of resistor. Thereafter, the photoresist 29 is removed. Photoresist 37 is formed on the upper surface of the substrate as shown in FIGS. 1L and 1L', and the impurities of group III such as boron are implanted with a low energy of about 30 KeV and a dose of $10^{15}$ to $10^{16}$ ions/cm$^2$ so as to form the source and drain region 38 of the PMOS transistor, and the connecting region 39 for the second region of the NMOS transistor, after which the photoresist 37 is removed. On the whole surface of the silicon substrate is formed an oxide layer 40 by conventional CVD, as shown in FIGS. 1M and 1M'. On the whole surfaces of the oxide layer 40 is deposited photoresist 41, and by conventional photolithography are formed the emitter region 42 of polycrystalline silicon emitter NPN transistor and the butting contact 43 of resistor portion thereof, and the contact portion 44 of the first polycrystalline silicon and the second polycrystalline silicon. In this case, by adjusting the etching time is made an over etch by about 20%. The CVD oxide layer has an etching speed higher than that of the thermally grown oxide layer, which helps the etching adjustment.

After removing the photoresist 41, the texture of the CVD oxide layer is densified by conventional heat treatment. Being used as polycrystalline silicon emitter electrode material, resistor of the passive element using polycrystalline silicon, and connecting material, second polycrystalline silicon layer 45 is formed on the whole surface of the silicon substrate by conventional method.

As shown in FIGS. 1N and 1N', in order to only preserve the polycrystalline layers of the polycrystalline silicon region 114 of polycrystalline silicon emitter NPN transistor, second polycrystalline silicon region 116 of the butting contact region and the resistor element region of the order of G$\Omega$/$\square$, several hundreds $\Omega$/$\square$ resistor element region 118 employing second polycrystalline silicon layer, and second polycrystalline silicon portion 120 for connecting with first polycrystalline silicon is deposited photoresist 46, and the polycrystalline layer is removed by conventional etching method, after which the photoresist 46 is removed by conventional method.

In order to selectively adjust the magnitude of the electrical property of the passive element made of polycrystalline material is formed photoresist to make a masking so as to protect the resistor region 122 of the order of G$\Omega$/$\square$, and the impurities of group V such as arsenic are implanted with a suitable dose so as to give the polycrystalline silicon emitter region a surface resistivity of several hundreds $\Omega$/$\square$, after which the photoresist is removed by conventional method. Then, on the whole surface of the silicon substrate are formed a conventional CVD oxide layer 47 and a conventional PSG layer 48, which is thermally treated so as to activate the impurities implanted into the regions 30,31,32,33,34,35,38 and 39 to cohere the oxide layer 47, and to smooth the silicon surface.

As shown in FIGS. 0 and 0', on the whole surface of the substrate is formed photoresist 49, and by conventional photolithography are formed connecting region window 124 and source and drain region window 125 of PMOS transistor, source and drain region window 126 of NMOS transistor, the second region connecting window 127 of NMOS transistor, the base connecting region window 129 emitter connecting region window 128 and collector connecting region window of polycrystalline silicon emitter bipolar NPN transistor, and the emitter connecting region window 131, base connecting region window 132 and collector connecting region window 133 of metal contact emitter NPN transistor, capacitor electrode region window 134,135, resistor region window 136,137,138, and the connecting region window 139 of first polycrystalline silicon and second polycrystalline silicon. After removing the photoresist 49, metal layer 50 is formed by using conventional vacuum deposition, and then is deposited photoresist. As shown in FIGS. 1P and 1P', etching the metal layer 50 gives the first region focusing electrode 140, source and drain electrode 141 of PMOS transistor, source and drain electrode 142 and the second region focusing electrode 143 of NMOS transistor, emitter electrode 144 and base electrode 145 and the third region collector electrode 146 of polycrystalline silicon emitter NPN transistor, emitter electrode 147 and base electrode 148 and the fourth region collector electrode 149 of metal contact emitter NPN transistor, MOS capacitor electrodes 150, 151, electrodes 152, 153, 154 of resistor region of the order of G$\Omega$/$\square$ and several hundreds $\Omega$/$\square$, and contact region electrode 155 of first polycrystalline silicon and second polycrystalline silicon. Thereafter, the photoresist is removed by conventional method. After removing the photoresist on the electrodes, a protecting layer 51 is deposited to protect the semiconductor device.

Figure 2:
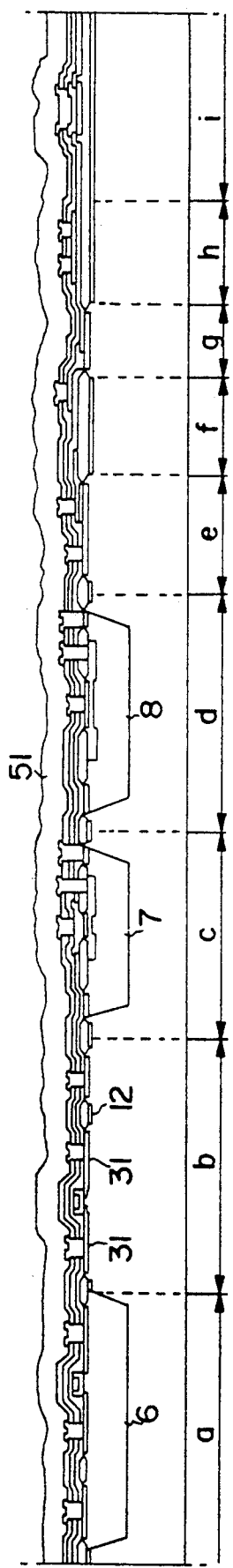
FIG. 2 is a cross-section of a semiconductor device produced by the method of the present invention.

FIG. 2 illustrates a cross-section of a BiCMOS device fabricated through the above method, wherein the region a indicates PMOS transistor region, the region b NMOS transistor region of LDD structure, the region C polycrystalline silicon emitter NPN transistor region having self-aligned structure, the region of metal contact emitter NPN transistor region having self-aligned structure, the region e MOS capacitor region, the region f polycrystalline silicon resistor region having a high resistivity of the order of G$\Omega$/$\square$, the region g butting contact region, the region h polycrystalline silicon resistor region having the resistivity of the order of several hundreds $\Omega$/$\square$, and the region i the contact region connecting first polycrystalline silicon layer and second polycrystalline silicon layer.

Figure 3:
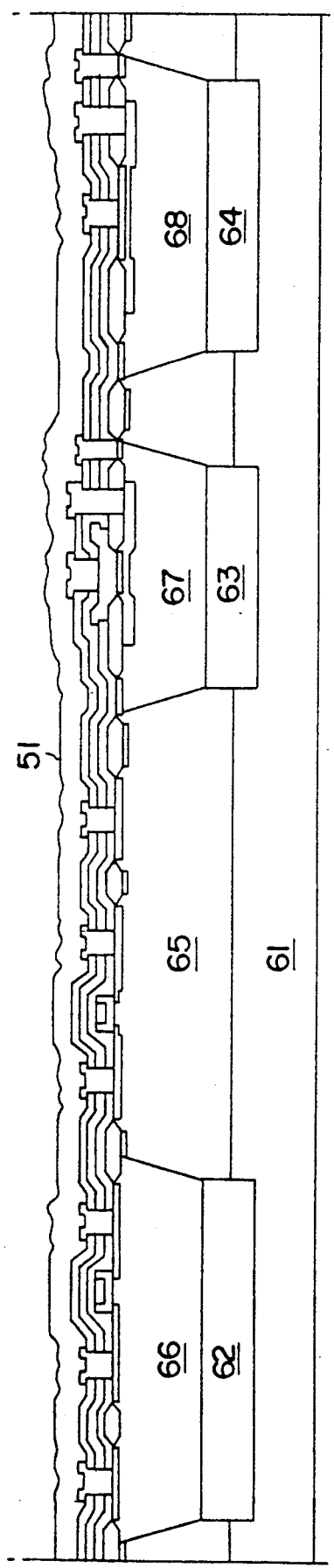
FIG. 3 is a cross-section of the active element portion produced by another embodiment of the present invention.

FIG. 3 illustrates a cross-section of the active element portion produced by another embodiment of the present invention. Although in the embodiment of FIGS. 1A to 1P is explained the present invention, based on the triple diffusion structure, the present invention is also suitable for forming a BiCMOS device of the standard bipolar transistor structure having a buried layer and an epitaxial layer as shown in FIG. 3. The BiCMOS device as shown in FIG. 3 comprises first conductivity-type single crystal silicon chip 61 of low concentration on which are formed second conductivity-type buried layer 62,63,64, followed by first conductivity-type epitaxial layer 65 of high concentration. Then, the first region 66 forming the first MOS transistor having first conductivity-type channel, and the second and third regions 67,68 forming first and second bipolar transistors are formed in the buried layers 62,63,64 of second conductivity-type.

Here, successively carrying out the method as shown in FIG. 1(B)-(P), there is obtained a BiCMOS device which includes a P-channel field effect transistor, N-channel field effect transistor, polycrystalline silicon emitter bipolar transistor, and metal contact emitter bipolar transistor. In fact, on a P-type single crystal silicon having the crystal orientation <100> and the resistivity of 0.006-0.1 $\Omega$·cm are successively formed a high concentration N-type buried layer, a P-type epitaxial layer, and the N-type first region and third region, which is caused to undergo the method as shown in FIGS. 1(B)–(P), providing a BiCMOS device as shown in FIG. 3.

Figure 4K:
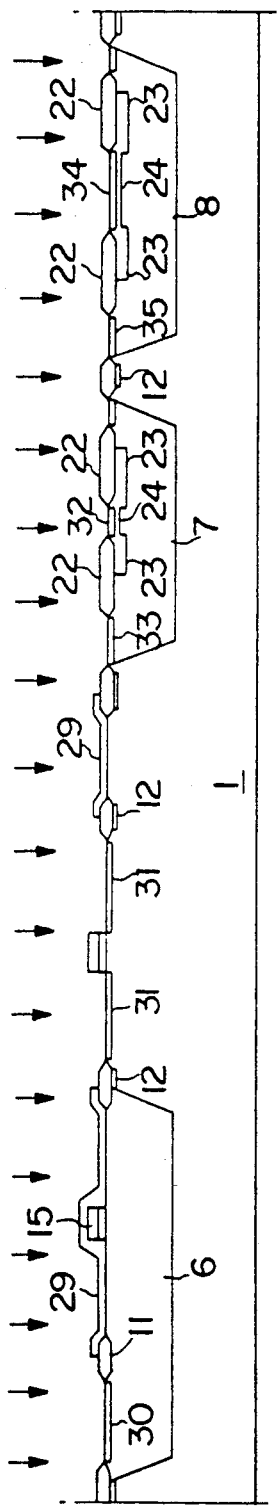
FIGS. 4K to 4P illustrate cross-sectionally another embodiment of the method according to the present invention.

FIGS. 4K to 4P illustrate cross-sectionally another embodiment of the method according to the present invention. On a P-type single crystal silicon chip as shown in FIG. 1 or a low concentration P-type single crystal silicon chip is formed a high concentration P-type epitaxial layer, and thereafter, is carried out the method as shown in FIGS. 1A to 1G. The nitride layer 18, the oxide layer 13 below the nitride layer, and the oxide layer 17 on the first polycrystalline silicon are removed so as to expose predetermined portions of the chip, on which a mask of photoresist is deposited for forming the active base region of the NPN transistor. Into the predetermined exposed portions of the chip are implanted the impurities of group III such as boron so as to form low concentration active base region 24 of the NPN transistor formed on the fourth region of the chip. Thereafter, the photoresist is removed. Subsequently, as shown in FIG. 4K, on the upper surface of the silicon substrate is deposited photoresist 29, and the impurities of group V such as arsenic are implanted with an energy of about 40-80 KeV and a dose of $10^{14}$ to $10^{16}$ ions/cm$^2$ so as to form connecting region 30 of the first region of PMOS transistor, source and drain region 31 of NMOS transistor, emitter region 32 and collector connecting region 33 of the third region of polycrystalline silicon emitter NPN transistor, and emitter region 34 and collector connecting region 35 of the fourth region of metal contact emitter NPN transistor. Thereafter, the photoresist is removed.

Figure 4L:
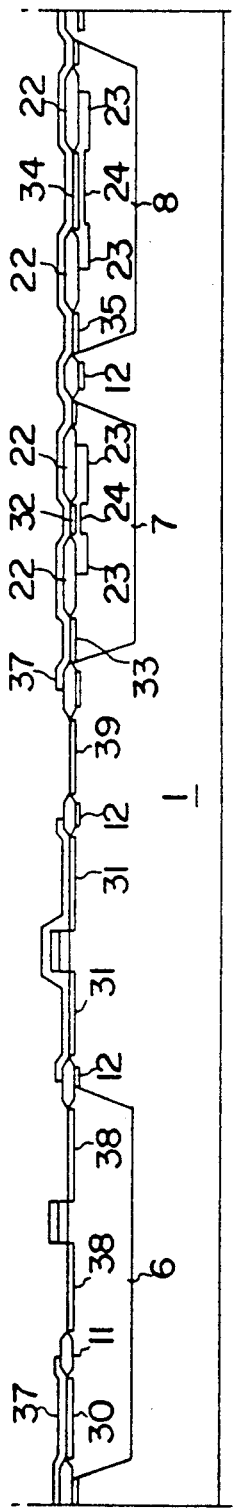
Figure 4M:
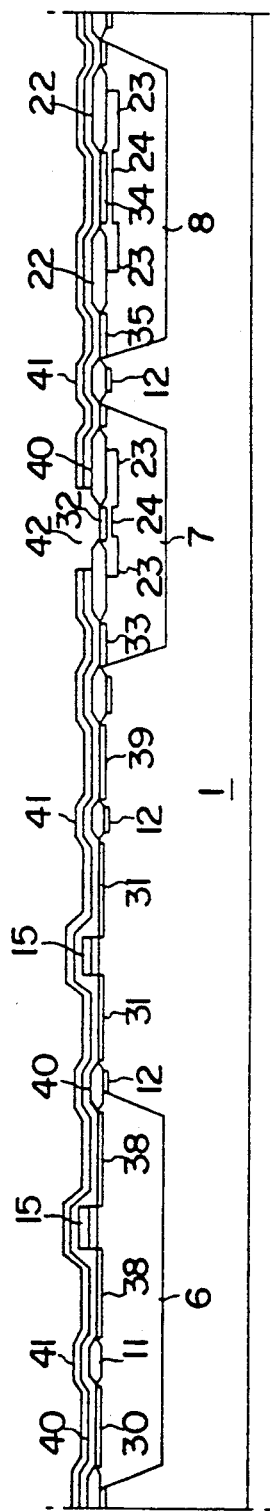
Figure 4N:
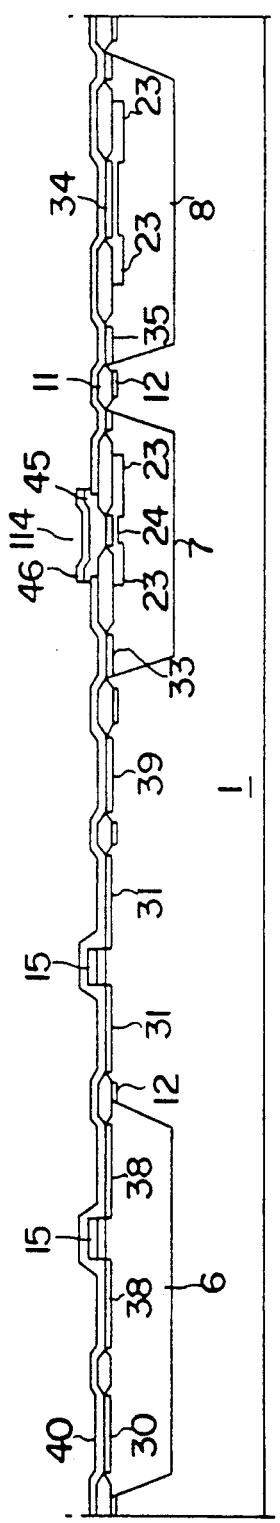
Figure 4O:
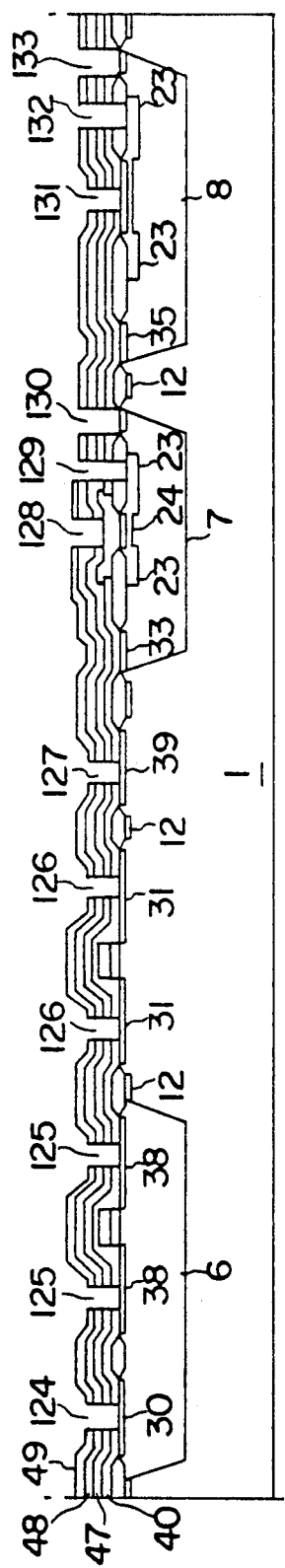
Figure 4P:
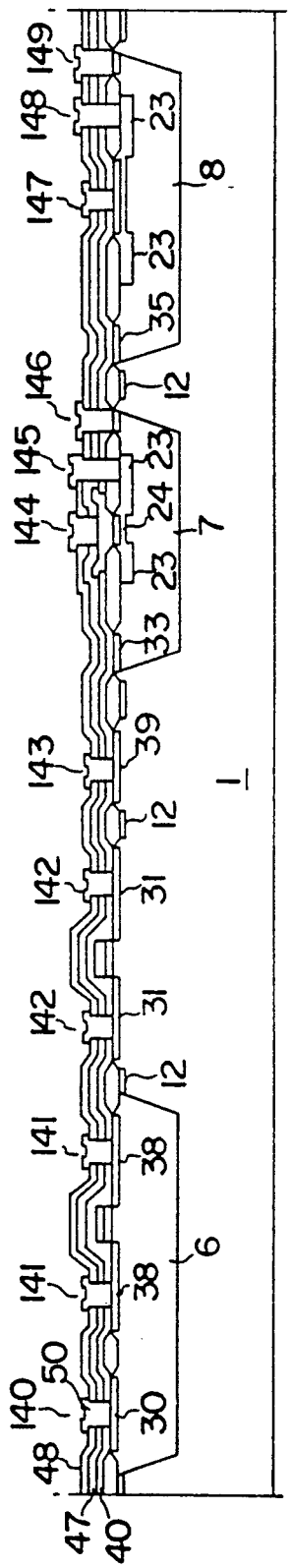

The method after FIG. 4(L) is the same as the method after FIG. 1(L), and the same reference numerals are used for the parts that the drawings of FIGS. 4K to 4P have the same relations with FIGS. 1K to 1P. In FIGS. 4K to 4P is shown the active element of a BiCMOS transistor according to the present invention, and the passive element not shown may-be formed by the same method as above, as shown in FIGS. 1(K')–(P').

The method described as above, unlike the embodiment of FIGS. 2 and 3, provides a BiCMOS device having conventional NMOS transistor instead of NMOS transistor of LDD structure.

As described hereinbefore, the present invention embodies a high integration and high performance MOS transistor in a BiCMOS device, and provides a high precision bipolar transistor of high performance matching characteristic simultaneously with NMOS forming, which has an application in an analog circuit. Consequently, the present invention suitably integrates polycrystalline silicon emitter NPN transistors of small emitter area particularly suitable for high speed digital, metal contact emitter NPN transistors particularly suitable for high precision analog and high load drive, high quality MOS capacitor, biases for various circuits, polycrystalline silicon resistors for load, etc., and the interconnections between them, so that there are obtained high performance logic circuits, high performance digital VLSI circuits data converters, analog VLSI circuits such as switched capacitor circuit, etc., which is impossible with the prior art. Further, the present invention can form a self-aligned shallow base through a simple method, so that scaling down of element is easily carried out.

What is claimed is:
1. A semiconductor device made by:

providing a semiconductor substrate having a first conductivity-type;

implanting second conductivity-type ions into particular regions of said substrate to provide implanted regions and activating said implanted regions to form a first region for a first MOSFET, a second region for a first bipolar transistor, and a third region for a second bipolar transistor;

forming element-isolation oxide thin film layers between elements of said first MOSFET, first bipolar and second bipolar transistors to isolate said elements from each other on said substrate, and forming a first conductivity-type channel stopper region below said oxide layers;

forming a first oxide thin film layer for gates of said first MOSFET and for a second MOSFET on an upper surface of said substrate;

forming said gates of said first and second MOSFETs by depositing and doping a first layer of polycrystalline semiconducting material over said first oxide thin film layer in said first region and a second region;

depositing a nitride thin film layer for masking on a whole upper surface of said substrate and removing said nitride layer from selected portions of said third and fourth regions of said substrate;

etching said first oxide layer off selected portions of said third and fourth regions and implanting first conductivity-type ions into the etched portions to form inactive base regions of said first and second bipolar transistors;

forming second oxide thin film layers on said third and fourth regions of said substrate by employing said nitride layer as a mask;

implanting first conductivity-type ions into selected portions of said third and fourth regions of said substrate to form active base regions of said first and second bipolar transistors;

implanting second conductivity-type ions to form low concentration drain and source regions of said second MOSFET;

forming a third oxide thin-film layer on the whole surface of said substrate and etching said oxide layer without any separate mask so as to form oxide-layer spacers on sidewalls of gate regions for said gates of said first and second MOSFETs;

implanting second conductivity-type ions to form a substrate connecting region for said first region of said first MOSFET, a collector connecting region of said second and third regions, an emitter region of said second bipolar transistor, and high concentration drain and source regions of said second MOSFET;

implanting first conductivity-type ions so as to form drain and source regions for said first region of said first MOSFET and a substrate connecting region for said second region of said second MOSFET;

forming a fourth oxide thin film layer on the whole surface of said substrate and making an emitter connecting window of said first bipolar transistor;

forming an emitter connecting portion of said first bipolar transistor with a second polycrystalline layer on the upper portion of said third region; and making windows for connecting with the drain and source regions of said first and second MOSFETs, the emitter, base and collector regions of said first and second bipolar transistors, and the substrate connecting regions of said first and second MOSFETs.

2. The semiconductor device according to claim 1, further comprised of:

element isolation oxide thin film layers disposed between said elements and a capacitor region;

first conductivity-type channel stop regions disposed below said element-isolation oxide thin film layers;

an oxide thin film dielectric layer disposed over the lower electrode of said capacitor;

an upper electrode of said capacitor over the dielectric layer of said capacitor; and a conduction layer coupled to said upper electrode.

3. The semiconductor device according to claim 1, further comprised of:

element-isolation oxide thin film layers being disposed between said elements and a resistor region to form an electrically conducting connection to said resistor region;

first conductivity-type channel stop regions disposed below said element-isolation oxide thin film layers;

an ion implantation region disposed below said electrically conducting connection of said resistor region; and a connecting window forming a butting contact of said resistor region.

* * * * *

UNITED STATES PATENT AND TRADEMARK OFFICE
CERTIFICATE OF CORRECTION

PATENT NO. : 5,173,760
DATED : Dec. 22, 1992
INVENTOR(S) : Sung-Ki MIN et al.

It is certified that error appears in the above-indentified patent and that said Letters Patent is hereby corrected as shown below:

Column 3,

Line 50,     after " a ", change "DBiCMOS" to --BiCMOS--:

Signed and Sealed this

Ninth Day of July, 1996

Attest:

BRUCE LEHMAN

Attesting Officer      Commissioner of Patents and Trademarks